United States Patent [19]
Breitbach et al.

[11] Patent Number: 5,891,577
[45] Date of Patent: Apr. 6, 1999

[54] ACTUATOR WITH A TRIGGERABLE ELEMENT OF VARIABLE LENGTH MADE OF A MULTIFUNCTIONAL ELEMENT

[75] Inventors: Elmar J. Breitbach, Göttingen; Thilo Bein, Brunswick, both of Germany

[73] Assignee: Deutsche Forschungsanstaltfur Luft-Und Raumfahrt E.V., Germany

[21] Appl. No.: 838,795

[22] Filed: Apr. 10, 1997

[30] Foreign Application Priority Data

Oct. 4, 1996 [DE] Germany ................. 196 14 044.7

[51] Int. Cl.$^6$ .............................. H02N 2/04; H01L 41/09
[52] U.S. Cl. .......................................... 428/411.1
[58] Field of Search ........................................... 428/411.1

[56] References Cited

U.S. PATENT DOCUMENTS

| | | | |
|---|---|---|---|
| 4,383,195 | 5/1983 | Kolm et al. | 310/330 |
| 4,922,096 | 5/1990 | Brennan | 244/3.16 |
| 5,334,903 | 8/1994 | Smith | 310/358 |
| 5,350,966 | 9/1994 | Culp | 310/328 |
| 5,410,207 | 4/1995 | Miura et al. | 310/328 |
| 5,424,596 | 6/1995 | Mendenhall et al. | 310/328 |
| 5,440,193 | 8/1995 | Barrett | 340/328 |
| 5,466,985 | 11/1995 | Suzuki | 310/333 |
| 5,559,387 | 9/1996 | Beurrier | 310/32.8 |
| 5,588,466 | 12/1996 | Benz et al. | 137/831 |

FOREIGN PATENT DOCUMENTS

| | | |
|---|---|---|
| 3435136A1 | 4/1985 | Germany . |
| 4025435A1 | 12/1990 | Germany . |
| 4220226A1 | 12/1993 | Germany . |
| 56-32781 A | 4/1981 | Japan . |

OTHER PUBLICATIONS

Lalande et al., "Impedance Modeling of In–Phase Actuation of Actuators Bonded on Ring Structures," AD–vol. 45/MD-vol. 54, Adaptive Structures and Composite Materials: Analysis and Application ASME 1994, pp. 193–200.

*Primary Examiner*—Mukund J. Shah
*Assistant Examiner*—Deepak R. Rao
*Attorney, Agent, or Firm*—Womble Carlyle Sandridge & Rice, PLLC

[57] ABSTRACT

An actuator (1) having at least one triggerable element (4,5) of variable lengths made of a multifunctional material (6) for large regulating distances is disclosed. The multifunctional material is arranged in layers on a deformable platform carrier structure 93), the carrier structure and the multifunctional material being disposed symmetrically about a longitudinal center plane (7) of the actuator. The carrier structure includes at least a pair of arcuate sections formed on both sides of the longitudinal center plane of the actuator, each such arcuate section describing an arc of at least 180°. The triggerable elements of variable lengths may be actuated with heat supplied by a separate heat source, or by electricity provided from a separate source of electricity so that the triggerable elements either expand or contract, thus moving a stringer (26) formed as a part of the carrier for performing the desired actuation function.

17 Claims, 4 Drawing Sheets

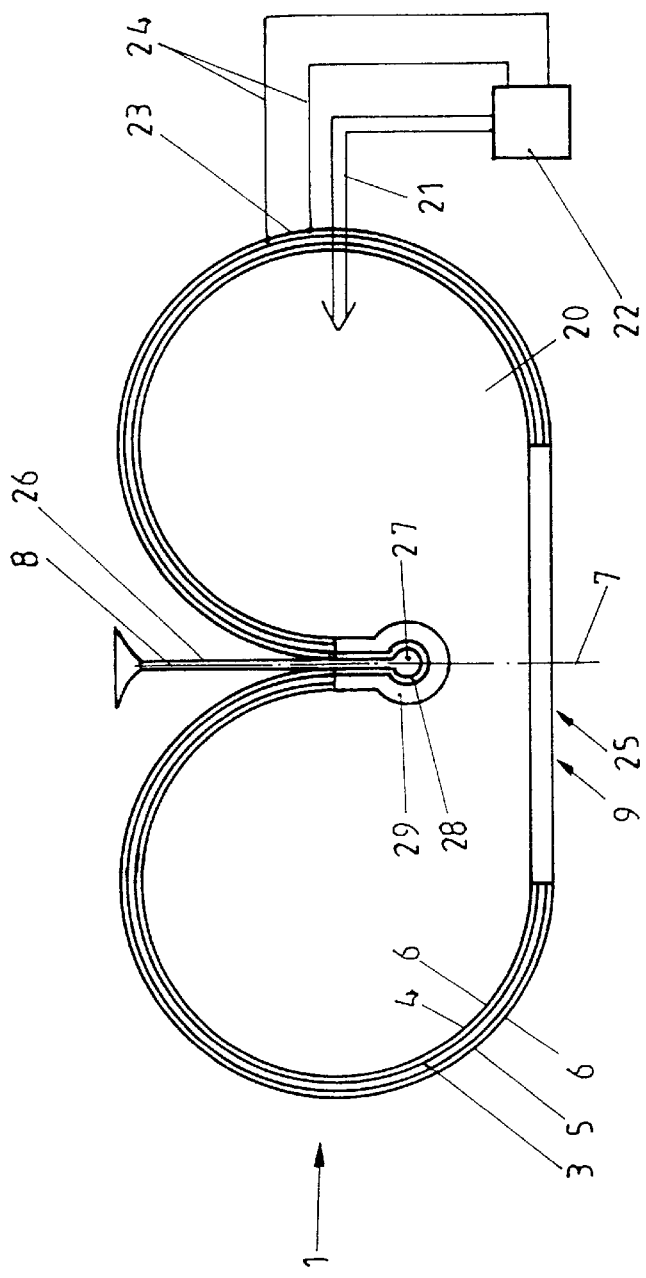
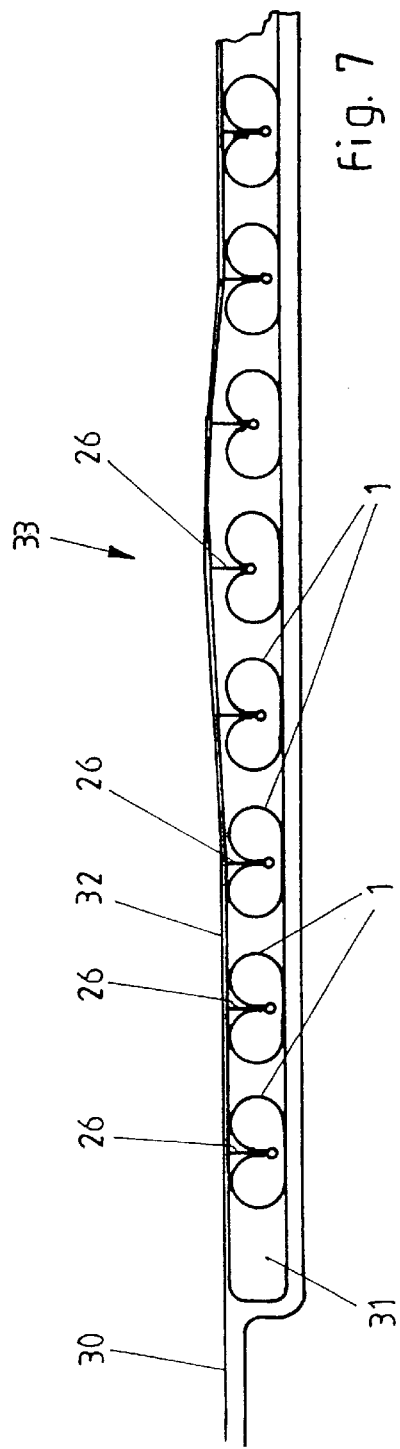

ACTUATOR WITH A TRIGGERABLE ELEMENT OF VARIABLE LENGTH MADE OF A MULTIFUNCTIONAL ELEMENT

FIELD OF THE INVENTION

This invention relates to an actuator having at least one triggerable element of a variable length, the triggerable element being made of a multifunctional material, the actuator being adapted to provide a relatively large regulating distance.

BACKGROUND OF THE INVENTION

Multifunctional materials are materials which undergo a deformation or exert deformation forces if the deformation is prevented as a reaction to a physical parameter which can be externally altered. Examples of multifunctional materials are piezoceramics, piezopolymers, electrostrictive ceramics and electrorheological liquids, where the required deformation is achieved through the application of an electric field, magnetostrictive alloys and magnetorheological liquids, where the required deformation is achieved through the application of a magnetic field, as well as shape memory alloys, shape memory polymers and hybrid material systems, where the desired deformation is achieved through a change in temperature.

The arbitrary deformation of multifunctional materials is exploited in the design of actuators. The most common example are those piezoceramics directly used as actuators. The disadvantage here is the short regulating distance of all actuators in which the deformation of the multifunctional material is directly exploited.

It is thus necessary to provide a displacement transmission for the deformation of the multifunctional material if large regulating distances have to be implemented. Known displacement transmissions include mechanical and hydraulic levers, though these contain a number of moving parts and thus display a high weight and great susceptibility to faults.

SUMMARY OF THE INVENTION

An object of the invention is thus to provide an actuator in which the deformation of the multifunctional material is converted into a large regulating distance in an actuator of a simple and lightweight design.

This object is achieved by the invention in that the actuator for large regulating distances has at least one triggerable element of variable length made of a multifunctional material, whereby the multifunctional material is arranged in layers on a deformable planiform carrier structure, whereby the carrier structure and the multifunctional material are designed to mirror one another and are symmetrical about a longitudinal center plane of the actuator and the carrier structure displays curved sections on both sides of the longitudinal center plane of the actuator, each of which describes an arc of at last 180°.

The laminar arrangement of a multifunctional material on a planiform structure is itself known from the publication "IMPEDANCE MODELING OF IN-PHASE ACTUATION OF ACTUATORS BONDED ON RING STRUCTURES" (AD-Vol. 45/MD-Vol. 54, Adaptive Structures and Composite Materials; Analysis and Application; ASME 1994; Pages 193 to 200). This describes actuators in the form of piezoceramics arranged on the inside and outside of a structure which is curved in the shape of cylinder jacket sections. The vibration behavior of the structure is actively influenced through an actuation of the actuators as a reaction to the vibrations of the structure. According to the publication, the new actuator described here is not created from the structure and piezoceramic since the structure in the sense of the invention is not deformable but rigid. In the publication the deformation paths of the structure are not mentioned at all.

The deformation of the carrier structure is, however, essential for the invention. The deformation of the multifunctional material is transmitted by the carrier structure, whereby the carrier structure is itself deformed. The desired large regulating distances of the actuator can then be transcribed at the carrier structure.

The curved sections preferably describe an arc of 270° on both sides of the longitudinal center plane of the actuator, whereby the free ends of the curved sections are aligned on the inside of the actuator and are parallel to one another, and a displacement transmission element can be connected to the free ends of the curved sections. This leads to a linear guidance of the displacement transmission element.

The carrier structure can be of a one-part design.

Multifunctional materials which are very suitable for the invention are piezoceramics, piezopolymers, electrostrictive ceramics, magnetostrictive alloys, shape memory alloys and shape memory polymers since these can either be glued onto the carrier structure or deposited directly onto the carrier structure. Plasma coating can be used, for example, as a depositing method. Electro- or magnetorheological liquids, on the other hand, must be enclosed in a deformable vessel which is then mounted on the carrier structure if they are to be used in the invention.

The carrier structure is preferably elastic and made of a fiber composite material or alloy. The carrier structure not only has translation functions for the deformation of the multifunctional material, it also assumes the function of a spring connected parallel to the multifunctional material. The actuator can thus assume the function of the control of the multifunctional materials even in the event of a failure. Fiber composite materials are preferable to alloys for the carrier structure if the actuator is to weigh as little as possible.

The carrier structure displays a curvature in at least one main direction of extension in its basic design. It can display a straight course vertical to this. With a constant curvature of the carrier structure this shape corresponds to that of a cylinder jacket section. The given curvature of the carrier material avoids the unstable equilibrium of the carrier structure with a flat design.

Two mirror displacement transmission elements can be provided which are symmetrical about the longitudinal center plane of the actuator.

The multifunctional material is preferably arranged at least over the last 180° of the curvature of the curved sections before their free ends.

The multifunctional material can be arranged on both sides of the planiform carrier structure. However, depending on the application it may be sufficient to provide the multifunctional material on the outside of a curved carrier structure.

Multifunctional materials not only have the property of undergoing deformation depending on a physical parameter, a physical parameter can also be callipered from an external deformation on these materials, the size of which depends on the extent of the deformation. The multifunctional material on the carrier structure is thus also useful to create a deformation sensor for the carrier structure. This makes it possible to carry out a real-time control of the regulating distance, i.e. a controlled actuation of the actuators.

As already mentioned, the carrier structure can display elastic properties. In addition, it may be desirable to connect a spring parallel to the carrier structure. The effective elastic properties of the carrier structure can be altered with this spring. This applies to both the spring hardness and the spring resilience of the actuator. These two parameters are also important since they counteract the deformation of the carrier structure through the actuation of the elements of variable length in the multifunctional material.

The spring can be a pneumatic spring enclosed by the carrier structure. The spring in turn can be actively triggered so as to alter its effects on the elastic properties of the overall actuator or to even create a second actuatory influencing possibility. It is even possible to connect a spring with negative rigidity parallel to the carrier structure to exert the smallest possible counterforces on the deformation of the elements of variable length in the multifunctional material within the actuator's working range. The principles of such springs with negative rigidity are known, for example, from EP-OS 0 127 741.

The invention is shown in the drawings and will be explained in more detail in association with the following drawings.

BRIEF DESCRIPTION OF THE DRAWINGS

FIG. 6 an additional embodiment of the actuator based on the principle shown in FIG. 4.

FIG. 7 a cross-section view through the surface of a transonic wing with integrated actuators of the embodiment of the invention shown in FIG. 6.

DETAILED DESCRIPTION

Figure 1:
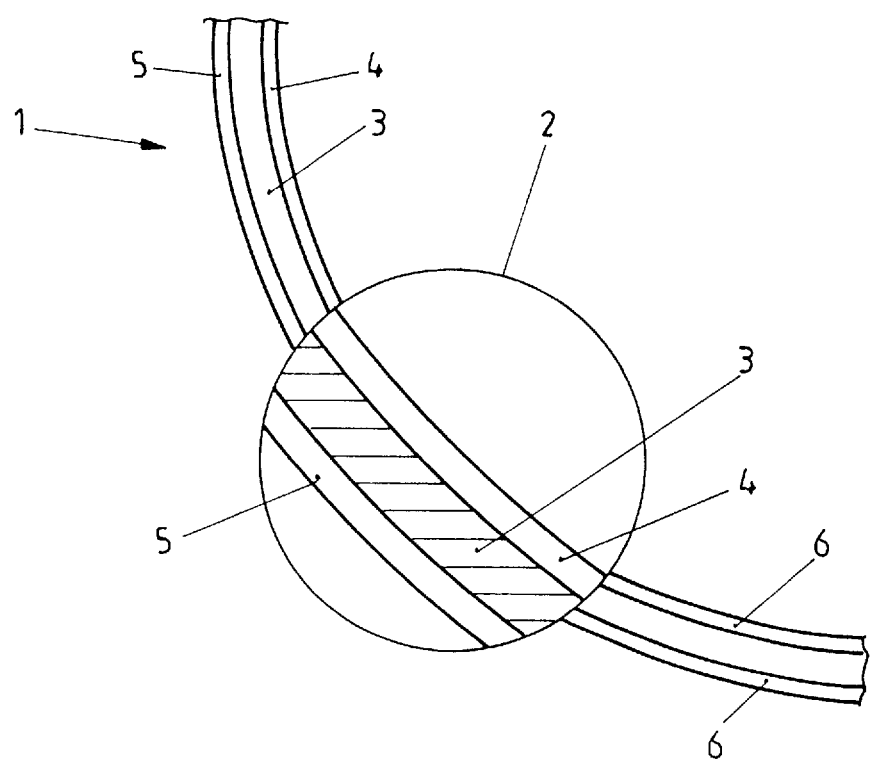
FIG. 1 a partially enlarged side view of the new actuator of this invention.

FIG. 1 shows a detail of an actuator 1 in a side view, whereby a section is further enlarged in the circle 2. The actuator 1 displays as its most important components a carrier structure 3 and elements of variable length 4 and 5 arranged on this carrier structure. The carrier structure 3 displays a planiform dimension, i.e. it essentially extends in the curved direction of extension shown in FIG. 1 and vertical to the plane of projection shown in FIG. 1, whereas it displays only a slight thickness compared to this. The carrier structure 3 here is made of a fiber composite material of a known type, whereby high-strength fibers are embedded in a matrix. The carrier structure 3 has a good stability thanks to this construction. Nevertheless, it can be elastically deformed to a certain extent. The elements of variable length 4 and 5, which are arranged on both sides of the carrier structure 3, are provided for a selective elastic deformation of the carrier structure 3. The elements of variable length are designed of a multifunctional material 6, in this case a piezoceramic. The length of the elements 4 and 5 changes when an electric field is applied. This deformation is transferred to the carrier structure 3. This hereby leads to a multiplication in the sense that the deformation of the carrier structure is associated with longer distances than the basic deformation of the elements of variable length 4 and 5. However, this only applies as long as only one of the two elements of variable length 4 and 5 is individually activated in the sense of a change in length or if the two elements of variable length 4 and 5 are activated in opposite directions, i.e. for example element 4 increases in length and element 5 decreases in length. The direction in which the change in length of elements 4 and 5 takes place in actuator 1 depends on the direction of curvature of the elements as shown in FIG. 1. The resulting deformation of the carrier structure is vertical to this, though also in the plane of projection shown in FIG. 1. The elements of variable length 4 and 5 can also be of a planiform design similar to the carrier structure 3. However, they can also be of a linear or strip-shaped design, whereby a number of elements of variable length 4 and 5 can be arranged one in front of the other in the viewing direction of FIG. 1. In any case, the elements 4 and 5 run parallel to the carrier structure 3. The thickness of the elements of variable length 4 and 5 on the carrier structure 3 is a small as possible so as to cause large deformations of the carrier structure through small deformations of the multifunctional material 6.

Figure 2:
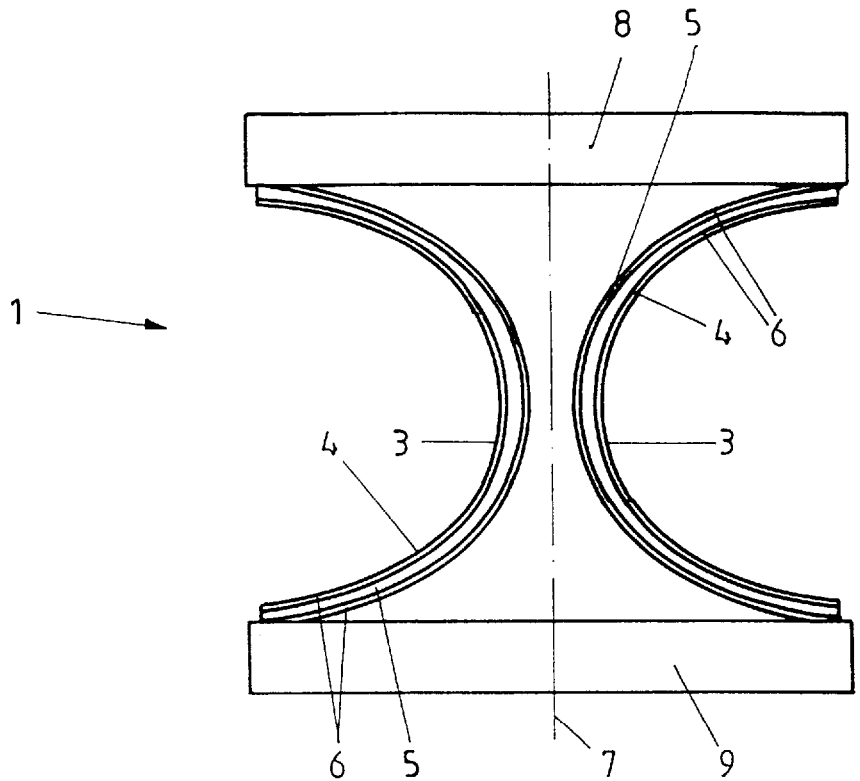
FIG. 2 a first embodiment of the new actuator displaying the detail shown in FIG. 1 in a neutral position.

FIG. 2 shows an actuator 1 which displays the detail shown in FIG. 1. Strictly speaking, actuator 1 as shown in FIG. 2 displays two semi-cylindrical jacket-shaped carrier structures 3 with elements of variable length 4 and 5 made of the multifunctional material. The curvature of each of the two semi-cylindrical jacket-shaped carrier structures 3 describes an arc of 180°. The two carrier structures are arranged mirrored with respect to one another and are symmetrical about a longitudinal center plane 7 of the actuator 1. The free ends of the approximately semi-cylindrical jacket-shaped carrier structures 3 are fastened to two opposite displacement transmission elements 8 and 9, which in turn are arranged symmetrical about the longitudinal center plane 7.

Figure 3:
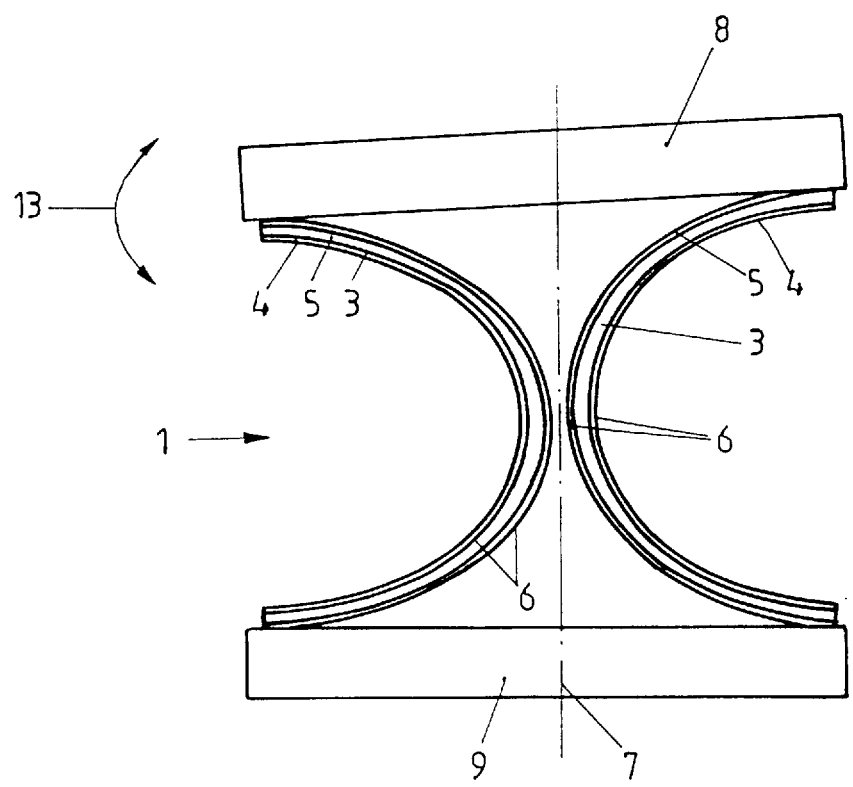
FIG. 3 the embodiment of the actuator shown in FIG. 2 in an activated position.

FIG. 3 shows a possibility for the activation of the actuator 1. By triggering the element of variable length 4 on the left semi-cylindrical jacket-shaped carrier structure 3 in the sense of a decrease in length, or by triggering the corresponding element 5 in the sense of an increase in length, the two displacement transmission elements 8 and 9 on the left of the longitudinal center plane 7 move closer together, i.e. the displacement transmission element 8 is tilted in the direction of the arrow 13 relative to the displacement transmission element 9. Through a simultaneous triggering of the elements of variable length 4 and 5 in the same direction on the right semi-cylindrical jacket-shaped carrier structure 3, the sum total of effects would be a movement of the displacement transmission elements 8 and 9 towards each other.

If the multifunctional material 6 is a piezoceramic, for example, it can be applied to the carrier structure 3 of a fiber composite material by plasma coating. The elements of variable length 4 and 5 can similarly be separately designed of the multifunctional material 6 before being glued or fastened to the carrier structure 3, for example. Other multifunctional materials can also be used in place of piezoceramic for the multifunctional material. Similarly, the carrier structure 3 can be made of a metallic alloy with suitable elasticity constants in place of a fiber composite material.

Figure 4:
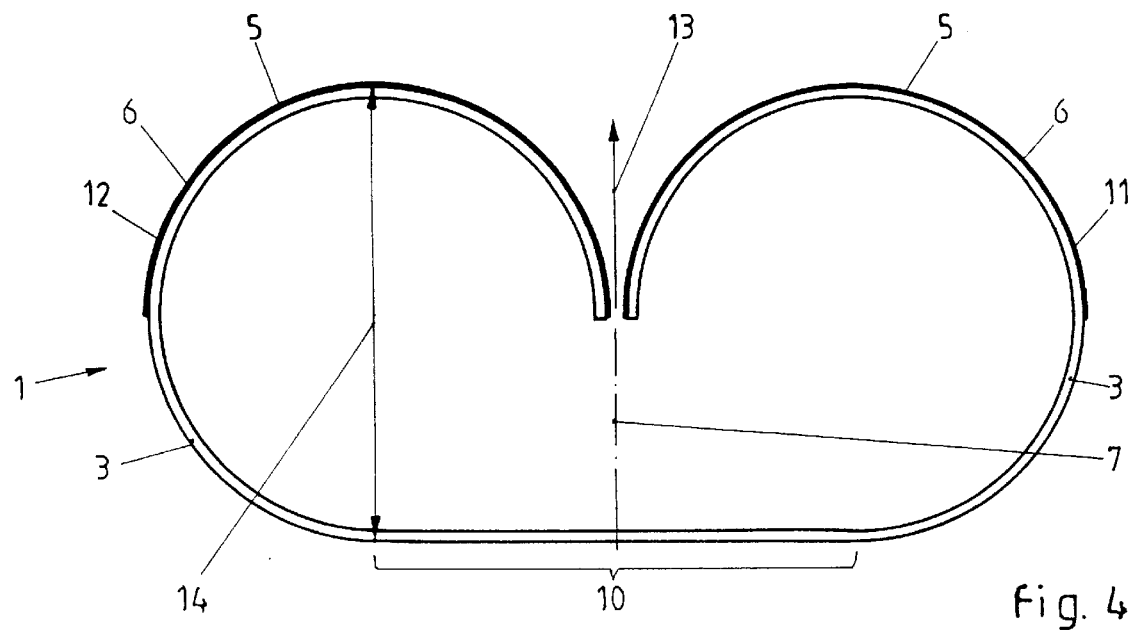
FIG. 4 a test set-up for a second embodiment of the actuator.

FIG. 4 shows a test set-up for actuator 1 in which the carrier structure 3 is again made of a fiber composite material, though a shape memory alloy is used as multifunctional material 6. The carrier structure 3 in actuator 1 as shown in FIG. 4 is of one-part construction and designed mirror-symmetrical along the longitudinal center plane 7. It consists of a straight section 10 and two cylinder jacket-shaped sections on either side of this, each of which describes an arc of 270°. The two free ends of the carrier structure 3 are bent inwards and lie parallel to one another. Two nickel-titanium flat wires 11 and 12, each 0.1 mm thick, are glued to the last 180° of each of the free ends of the carrier structure 3 with an Araldite adhesive. The thickness of the carrier structure 3 is one millimeter. The nickel-titanium flat wires are made of a shape memory alloy 11 and 12 and serve as the elements of variable length 5. They have been trained to display a two-way behavior (two-way effect), i.e. during a warm up-cool down cycle they contract and expand respectively. The relative change in length is of approximately 2%. The switching temperature of the nickel-titanium flat wires for this change in length is 65° C. If the entire actuator as shown in FIG. 1 is heated above this switching temperature the free ends of the carrier structure 3 move in the direction of the arrow 13 by 10 mm. Relative to the overall height 14 of the actuator 1 of 20 mm in the neutral position, the relative change in length is 50%. This is a very astonishing value, particularly in view of the simple design of the actuator 1. The extension of the actuator 1 as shown in FIG. 4 vertical to the plane of projection is 25 mm.

Figure 5:
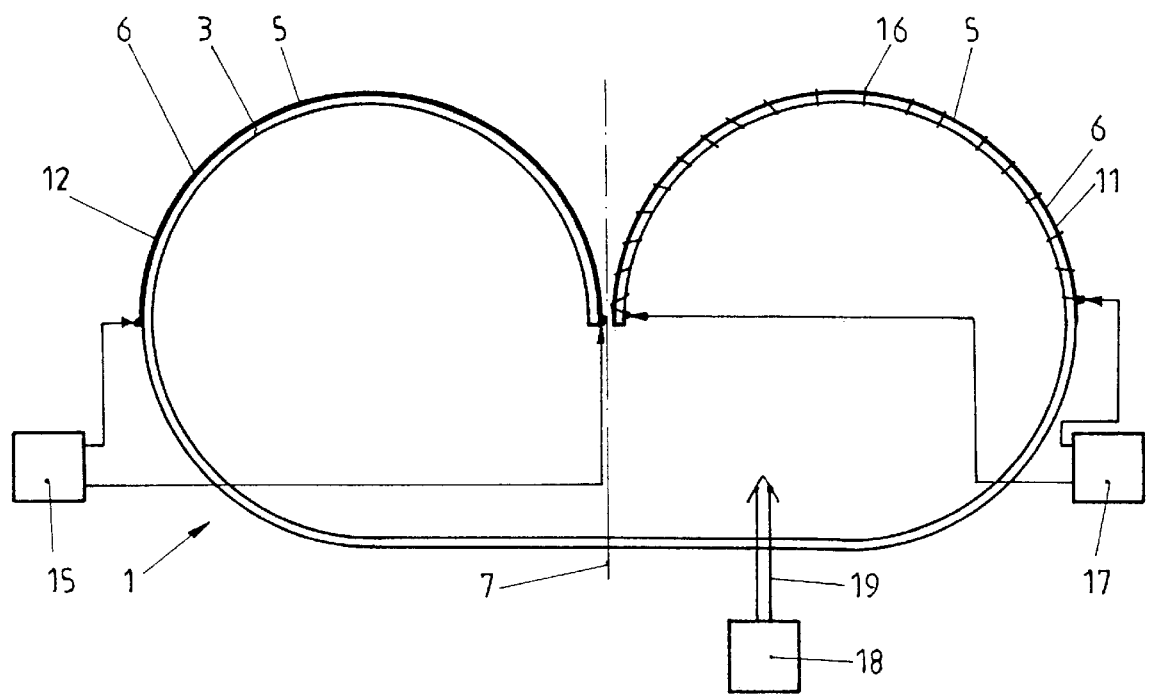
FIG. 5 an elementary diagram of various illustrative embodiments based on the test set-up shown in FIG. 4.

FIG. 5 shows various possibilities of activating the actuator 1 as shown in FIG. 4 without it having to be introduced as a whole into a furnace. The first possibility as shown in the left side of FIG. 5 includes contacting the nickel-titanium flat wire directly with a voltage source 15 so that this is directly heated according to the principle of resistance heating. The right side of FIG. 5, on the other hand, shows an indirect heating of the nickel-titanium flat wire 11 according to the principle of resistance heating. A resistance wire 16 is thus wound around the nickel-titanium flat wire 11 and connected to a power supply 17. As a third possibility, the inside of the carrier structure 3 can be heated with hot air 19 from a hot air source 18, so that the nickel-titanium flat wires 11 and 12 are similarly heated to above the switching temperature. However, this is more unfavorable from an energy point of view than the specific heating of the nickel-titanium flat wires 11 and 12 with the aid of the voltage source 17 or 15.

If piezoceramics are used as a multifunctional material 6 these can be connected to a voltage source to create the desired electrical field by electrodes provided on the carrier structure 3 in a manner similar to that shown in the left half of FIG. 5.

FIG. 6 shows an actuator 1 whose design is essentially the same as that of the actuators shown in FIGS. 4 and 5. However, here, an element of variable length 4 has been provided on the inside of the carrier structure 3 in addition to the element of variable length 5 on the outside of the carrier structure 3. Moreover, the carrier structure 3 is hermetically sealed and encloses a pneumatic spring 20. The elastic properties of the pneumatic spring 20 can be altered through the introduction of compressed air 21 with a compressed-air source 22. In this case there is a feedback to the compressed-air source 22 inasmuch as a section of the multifunctional material 6 is designed as a deformation sensor 23 for the structure 3. If a piezoceramic is used as a multifunctional material the signal 24 of the deformation sensor 23 is, for example, a voltage. The pneumatic spring 20 is switched parallel to the carrier structure 3 with respect to its elastic properties and serves to optimize its elastic properties in the working range of the sensor 1. The support surface 25 and a stringer 26 of the actuator 1 as shown in FIG. 6 serve as displacement transmission elements 9 and 8 for the actuator 1. The stringer 26 is snapped by an enlargement 27 into a recess 28 in a fastening element 29. The fastening element 29 connects the two free ends of the carrier structure 3 and ensures an airtight seal to hold back the pneumatic spring 20.

The use of the actuator as shown in FIG. 6 in an exemplary application is shown in FIG. 7. FIG. 7 shows a detail of the upper section of a transonic wing. The upper surface of the wing 30 displays a recess 31 which is covered by a flexible skin 32. A number of actuators 1 as shown in FIG. 6 are arranged beneath the skin 32 in succession in the direction of flow. When the actuators 1 are activated their stringers 26 are pressed against the flexible skin so that a so-called laminar bump can be produced at the desired point in the surface of the wing.

While preferred embodiments of the invention have been disclosed in the foregoing specification, it is understood by those skilled in the art that variations and modifications thereof can be made without departing from the spirit and scope of the invention, as set forth in the following claims. Moreover, the corresponding structures, materials, acts, and equivalents of all means or step plus function elements in the claims are intended to include any structure, material, or acts for performing the functions in combination with other claimed elements, as specifically claimed herein.

LIST OF REFERENCE SIGNS

1 Actuator
2 Circle
3 Carrier structure
4 Element of variable length
5 Element of variable length
6 Multifunctional material
7 Longitudinal center plane
8 Displacement transmission element
9 Displacement transmission element
10 Straight section
11 Nickel-titanium flat wire
12 Nickel-titanium flat wire
13 Arrow
14 Height
15 Voltage source
16 Resistance wire
17 Voltage source
18 Hot air source
19 Hot air
20 Pneumatic spring
21 Compressed-air
22 Compressed-air source
23 Deformation sensor
24 Signal
25 Support surface
26 Stringer
27 Enlargement
28 Recess
29 Fastening element
30 Upper surface of wing
31 Recess
32 Skin
33 Laminar bump

We claim:
1. An actuator for large regulating distances, said actuator comprising:
   at least one triggerable element of a variable length, said triggerable element being made of a multifunctional material;

at least one deformable planiform carrier structure, said carrier structure being formed symmetrically about a longitudinal center plane and having a first side surface, said multifunctional material of said at least one triggerable element being disposed in layers on said first side surface of said carrier structure;

a first arcuate section formed as a part of said carrier structure along said longitudinal center plane, said first arcuate section describing an arc of at least 180°;

a second arcuate section formed as a part of said carrier structure along said longitudinal center plane, said second arcuate section describing an arc of at least 180°;

said first and second arcuate sections being spaced from, and being positioned symmetrically with respect to, one another about said longitudinal center plane;

said at least one triggerable element being disposed on at least a portion of at least one of said arcuate sections; and at least one displacement transmission member operatively connected to said carrier structure, said displacement transmission member being positioned with respect to said arcuate sections and being constructed and arranged to move reciprocally toward and away from said carrier structure in a working direction along said longitudinal center plane in response to actuation of said triggerable element on said arcuate sections.

2. The actuator of claim 1, wherein each said arcuate section describes an arc of 270° on opposite sides of the longitudinal center plane of the actuator.

3. The actuator of claim 1, wherein the carrier structure is constructed and arranged as a unitary structure.

4. The actuator of claim 1, wherein said multifunctional material is disposed on said at least one side surface and extends along said arc for each said arcuate section.

5. The actuator of claim 1, wherein said multifunctional material is selected from one of the group of multifunctional materials consisting of a piezoceramic, a peizopolymer, an electrostrictive ceramic, a magnetostrictive alloy, a shape memory alloy, and a shape memory polymer multifuntional material.

6. The actuator of claim 1, wherein the multifunctional material is adhered to said at least one side surface of said carrier structure.

7. The actuator of claim 1, wherein the carrier structure is substantially elastic and is made of a fiber composite material.

8. The actuator of claim 1, wherein said carrier structure displays a straight course vertical to the direction in which the curved sections display their curvature.

9. The actuator of claim 1, wherein said planiform carrier structure comprises a second side surface spaced from and parallel to said at least one side surface, and further comprising a second triggerable element of a variable length made of said multifunctional material on said second side.

10. The actuator of claim 1, wherein said multifunctional material forms a deformation sensor for measuring the deformation of said carrier structure.

11. The actuator of claim 1, further comprising a spring positioned parallel to said carrier structure.

12. The actuator of claim 11, wherein said carrier structure includes a pneumatic spring.

13. The actuator of claim 12, wherein said spring is constructed and arranged to be actively triggered.

14. The actuator of claim 1, wherein said multifunctional material is deposited directly onto said at least one surface of said carrier structure.

15. The actuator of claim 1, wherein said carrier structure substantially elastic and is made of an alloy.

16. An actuator for large regulating distances, said actuator comprising:

a plurality of triggerable elements of a variable length, said triggerable elements being made of a multifunctional material;

at least one deformable planiform carrier structure, said carrier structure being formed symmetrically about a longitudinal center plane and having a first side surface and a second side surface, said multifunctional material of said triggerable elements being disposed in layers on said first and second side surfaces of said carrier structure;

a first arcuate section formed as a part of said carrier structure along said longitudinal center plane, said first arcuate section describing an arc of approximately 270°;

a second arcuate section formed as a part of said carrier structure along said longitudinal center plane of said actuator, said second arcuate section describing an arc of at least 270°;

said first and second arcuate sections being spaced from, and being positioned symmetrically with respect to, one another about said longitudinal center plane;

said triggerable elements being disposed on at least a substantial portion of said arcuate sections; and displacement transmission members operatively connected to said carrier structure and constructed and arranged to move reciprocally toward and away from said carrier structure in a working direction along said longitudinal center plane in response to actuation of said triggerable elements on said arcuate sections.

17. The actuator of claim 1, said carrier structure having a second side surface spaced from and parallel to said first side surface, and a second triggerable element of a variable length made of said multifunctional material and being disposed in layers on said second side surface of said carrier structure.

* * * * *